United States Patent [19]

Ikawa et al.

[11] Patent Number: 5,369,658
[45] Date of Patent: Nov. 29, 1994

[54] SEMICONDUCTOR LASER

[75] Inventors: Katsuhiko Ikawa; Hiroshi Mataki; Satoshi Uchida, all of Kyoto, Japan

[73] Assignee: Rohm Co., Ltd., Kyoto, Japan

[21] Appl. No.: 81,192

[22] Filed: Jun. 25, 1993

[30] Foreign Application Priority Data

Jun. 26, 1992 [JP] Japan .................................. 4-169666
Jun. 26, 1992 [JP] Japan .................................. 4-169668
Jun. 26, 1992 [JP] Japan .................................. 4-169669

[51] Int. Cl.[5] .............................................. H01S 3/19
[52] U.S. Cl. ................................... 372/45; 372/46; 372/49
[58] Field of Search ........................ 372/46, 45, 49

[56] References Cited

U.S. PATENT DOCUMENTS

| | | | |
|---|---|---|---|
| 4,815,089 | 3/1989 | Miyauchi et al. | 372/49 |
| 4,843,610 | 6/1989 | Okada et al. | 372/49 |
| 4,881,235 | 11/1989 | Chinone et al. | 372/46 |

Primary Examiner—Georgia Y. Epps
Attorney, Agent, or Firm—Nikaido, Marmelstein, Murray & Oram

[57] ABSTRACT

A self-aligned type, high-power semiconductor laser is provided which exhibits multi-longitudinal mode oscillation in the low-power operation (at a light power output of, for example, 3 mW) through it is of a refractive index guiding structure capable of single transverse mode oscillation in up to the high-power operation. Specifically, the semiconductor laser is of an AlGaAs system and has a waveguide mechanism resulting from complex refractive index, and wherein a current-blocking layer is 2000 to 6000 Å thick.

7 Claims, 7 Drawing Sheets

780nm

780nm

780nm

780nm

SEMICONDUCTOR LASER

FIELD OF THE INVENTION

The present invention relates to semiconductor lasers and, more particularly, to a high-power semiconductor laser of self-aligned structure having a waveguide mechanism resulting from complex refractive index profile, which laser is capable of a single transverse mode oscillation in up to a relatively high-power operation while exhibiting a multi-longitudinal mode oscillation in a low-power operation. This semiconductor laser is advantageously used as a pickup light source for compact disks, magneto-optical disks and the like.

BACKGROUND OF THE INVENTION

Recently, there has been strongly desired a high-power semiconductor laser capable of outputting a light power of 30 mW or more as a light source for writing to magneto-optical disks.

Such a semiconductor laser for magneto-optical disks needs to meet the following characteristic requirements:

(1) a single transverse mode oscillation in up to a high-power operation;
(2) small astigmatism (difference of beam waist position between the direction perpendicular to the heterojunction face and the direction parallel to the heterojunction face);
(3) low ellipticity;
(4) low noise; and
(5) high reliability.

In attempt to meet the requirements (1) and (2), there has been proposed a self-aligned semiconductor laser having a waveguide mechanism resulting from complex refractive index, which laser is of double heterojunction structure or MQW structure. The refractive index guiding structure of such a semiconductor laser is realized by a film thickness design such as to form a thin active layer or to make small the distance between an active layer and a current-blocking layer (refer to Ryoichi Ito et al., "Semiconductor Laser", Baifukan, 1989).

On the other side, it is known that the requirements of low ellipticity (3) and high reliability (5) as well as the requirement of small astigmatism (2) are met if there is provided in a clad layer adjacent the current-blocking layer a beam-expanding AlGaAs layer having an Al content lower than that of the clad layer (refer to Nakatsuka, "Reliability of 780 nm High-Power Laser Diodes with Quantum Well Active Layer", Japanese Journal of Applied Physics, Vol. 30, No. 3, pp. 493 to 498, March 1991).

With a semiconductor laser of the refractive index guiding structure, however, a single longitudinal mode oscillation is likely even in the low power operation at a light power of, for example, 3 mW, thus resulting in an increased coherence. It is known that such a semiconductor laser tends to produce returning-light-induced noise and does not meet the above requirement of low noise (4). Further, despite the merit of small astigmatism, the semiconductor laser provided with the beam-expanding layer tends to generate single longitudinal mode oscillation.

Attempts have been made to reduce such noise by superposing high frequency so as to turn the single longitudinal oscillation into multi-longitudinal mode oscillation (refer to D. Welford and A. Mooradian, "Observation of linewidth broadening in GaAlAs diode lasers due to electron number fluctuations", Appl. Phys. Lett., Vol. 40, p. 560, 1982). However, if the longitudinal mode oscilllation before the superposition of high frequency is strong in singleness, such superposition cannot lower a noise level sufficiently.

Alternatively, there is known a method employing a gain guiding structure (refer to Ryoichi Ito et al., "Semiconductor Laser", Baifukan, 1989) as means for realizing multi-longitudinal mode oscillation. However, a semiconductor laser of the gain guiding structure involves a problem of difficulty in maintaining single transverse mode oscillation in up to a high-power operation and, furthermore, suffers from an increased astigmatism.

SUMMARY OF THE INVENTION

It is, therefore, an object of the present invention to provide a self-aligned, high-power semiconductor laser of double heterostructure or MQW structure which has a waveguide mechanism resulting from complex refractive index profile. The semiconductor laser, although it is of refractive index-guiding structure capable of generating single transverse mode oscillation in up to a high-power operation, exhibits multi-longitudinal mode oscillation in a low power operation at a light power of, for example, 3 mW.

According to the present invention, there is provided a self-aligned type semiconductor laser of AlGaAs having a waveguide mechanism resulting from complex refractive index profile, which comprises an active layer, a clad layer on the active layer, and a current-blocking layer formed in the clad layer, the current-blocking layer being 2000 to 6000 Å thick capable of serving as an absorption medium with respect to an oscillation light.

The above semiconductor laser may be of a double heterostructure or the active layer may be of MQW structure.

It is preferable that the clad layer is composed of $Al_xGa_{1-x}As$ ($0.35 \leq x \leq 0.7$), the active layer of $Al_yGa_{1-y}As$ ($0 \leq y \leq 0.15$), and the current-blocking layer of GaAs. With respect to the MQW structure, average content of Al in the active layer is y.

The semiconductor device according to the present invention may further comprises a beam-expanding layer $Al_zGa_{1-z}As$ ($0.2 \leq z \leq 0.7$) which is sandwiched, together with a portion of the clad layer, between the active layer and the current-blocking layer, while the Al content z satisfies the relation $y < z < x$.

The distance between the active layer and the current-blocking layer is preferably 2500 to 3500 521 .

Preferably, the semiconductor laser is coated at its light-emitting face with an $Al_2O_3$ film having a thickness of $\lambda/4$ where $\lambda$ is a wavelength of laser light in the wave guide medium, and at its rear end face with a four-layers film in which an $Al_2O_3$ layer having a thickness of $\lambda/4$ and an amorphous silicon layer having a thickness of $\lambda/4$ are alternately stacked.

The MQW structure is preferably of a stacked structure wherein an $Al_pGa_{1-p}As$ layer and a GaAs layer are alternately stacked.

With the present invention, since the thickness of the current-blocking layer is adjusted to 2000 to 6000 Å, multi-longitudinal mode oscillation can be realized in a low power operation thereby sufficiently decreasing a noise level. This holds true for the semiconductor laser of either double heterostructure or MQW structure.

Also by virtue of the adjustment of the current-blocking layer thickness to 2000 to 6000 Å, even if the beam-expanding layer of $Al_zGa_{1-z}As$, where the Al content z is larger than that of the active layer and smaller than that of the clad layer, is formed between the active layer and the current-blocking layer, the semiconductor laser can exhibit multi-longitudinal mode oscillation in the low-power operation and thereby offers a decreased noise level while realizing a small astigmatism, low ellipticity and high reliability.

DETAILED DESCRIPTION

A semiconductor laser according to the present invention will now be described in detail with reference to attached drawings. The semiconductor laser, having a waveguide mechanism resulting from complex refractive index profile, is of a self-aligned structure wherein a current-blocking layer having a thickness of 2000 to 6000 Å is provided in a clad layer formed on an active layer.

Figure 1:
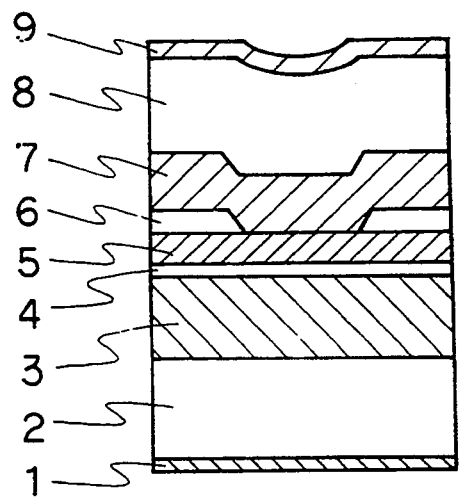
FIG. 1 is a schematic sectional view showing a semiconductor in accordance with Example 1.

Referring to FIG. 1, numeral 1 denotes a n-electrode, numeral 2 denotes a n-type GaAs substrate, numeral 3 denotes a n-type $Al_xGa_{1-x}As$ ($0.35 \leq x \leq 0.7$) clad layer, numeral 4 denotes a n-type $Al_yGa_{1-y}As$ ($0 \leq y \leq 0.15$) active layer, numeral 5 denotes a p-type $Al_xGa_{1-x}As$ lower clad layer, numeral 6 denotes a n-type GaAs current-blocking layer, numeral 7 denotes a p-type $Al_xGa_{1-x}As$ upper clad layer, numeral 8 denotes a p-type GaAs cap layer, and numeral 9 denotes a p-electrode.

When such a semiconductor laser is produced by a first molecular beam epitaxy process, a n-type $Al_xGa_{1-x}As$ layer as the clad layer 3, n-type $Al_yGa_{1-y}As$ layer as the active layer 4, p-type $Al_xGa_{1-x}As$ layer as the lower clad layer 5, and n-type GaAs layer as the current-blocking layer 6 are sequentially stacked on the n-type GaAs substrate 2. During producing, the beam intensity of a material for crystal growth and that of a dopant for each layer are appropriately selected. These layers will be generally referred to as "first growth layer". Si, Sn or the like for obtaining the n-type conductivity, and Be or the like for the p-type conductivity are used as the dopant metal.

In turn, a striped groove is removed by etching the surface of the first growth layer down to a depth such that about 1000 Å-thick GaAs of the current-blocking layer is retained. The reason why about 1000 Å-thick GaAs is retained is that the surface of the structure which is polluted in etching or the like will be cleaned by arsenic molecular beam to be described later or the like. The producing step is not necessarily required.

The structure with the thus formed striped groove is irradiated at its surface with arsenic molecular beam while being heated in the MBE apparatus. As a result, the GaAs retained in the bottom of the striped groove is evaporated and thereby the lower clad layer is exposed. Subsequently, on the resulting structure are stacked by a second MBE process a p-type $Al_xGa_{1-x}As$ layer as the upper clad layer 7 and p-type GaAs layer as the cap layer 8. The resulting structure is formed with the upper and lower electrodes 1 and 9, then cut into chips.

Although the GaAs substrate is of n-type in the above structure, it may be of p-type. In this case the conductivity type of each component needs to be reversed.

The semiconductor laser thus produced is of a SAM (Self Aligned structure by MBE) structure (refer to Haruo Tanaka, "Laser of Self-Aligned structure by MBE", Japanese Journal of Applied Physics, Vol. 24, p. 89, 1985).

The present invention is characterized by the specified thickness of the current-blocking layer 6. When the current-blocking layer is 2000 to 6000 Å thick, preferably 3000 to 5000 Å thick, a self-aligned, high-power semiconductor laser can be obtained which produces multi-longitudinal mode oscillation in a low power operation (at a light power of, for example, 3 mW) though it is of a refractive index guiding structure capable of single transverse mode oscillation in up to a high-power operation.

Figure 2:
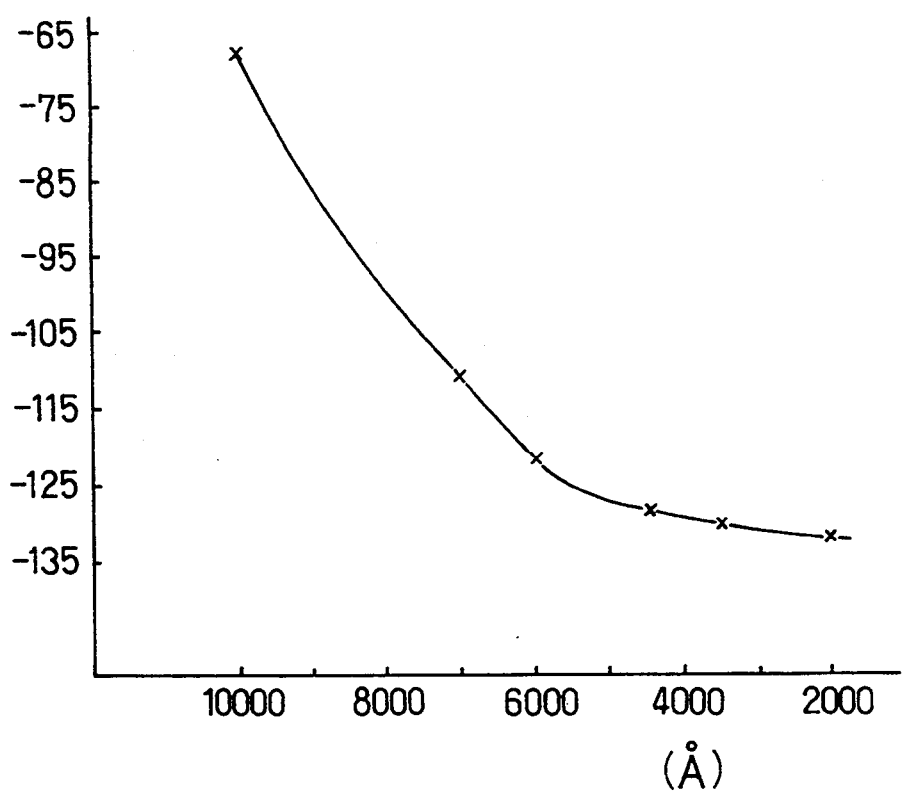
FIG. 2 is a graph of a relative intensity of noise (RIN) which varies with variation in the thickness of the current-blocking layer of a semiconductor laser according to Example 1.

The semiconductor laser with the thickness of the current-blocking layer 6 variously varied was examined for the relative intensity of noise (RIN) when returning light was present. As a result, as shown in FIG. 2, when the current-blocking layer 6 was 6000 Å thick or less, optical-feedback-induced noise was substantially decreased and multi-longitudinal mode oscillation was exhibited. In accordance with the result, the thinner is the current-blocking layer 6, the more favorable multi-longitudinal mode oscillation. However, when the current-blocking layer 6 is less than 2000 Å thick, it cannot exhibit a satisfactory current-blocking function; that is, the current-flowing region is broadened thereby to decrease the light-emitting efficiency undesirably. For this reason it is preferable to set the thickness of the current-blocking layer to 2000 to 6000 Å. It is more preferable to set the thickness to 3000 to 5000 Å so as to perform both satisfactorily decreased noise and improved light-emitting efficiency.

It is easy to adjust tile thickness of the current-blocking layer 6 by controlling the time for GaAs growth in the aforementioned MBE apparatus. With a GaAs growth rate of, for example, 1.0 μm/h, crystal growth for about 60 minutes would give a 10000 Å-thick layer, and that for about 36 minutes a 6000 Å-thick layer.

The distance between the active layer and the current-blocking layer, or the thickness of the p-type lower clad layer, is desirably 2500 to 3500 Å to exhibit stabilized transverse mode oscillation and small astigmatism. Even in this case, multi-longitudinal mode oscillation can be realized in the low power operation by adjusting the thickness of the current-blocking layer to 2000 to 6000 Å. Therefore, by adjusting the distance between the active layer and the current-blocking layer to 2500 to 3500 Å and the thickness of the current-blocking layer to 2000 to 6000 Å, the semiconductor laser perform sufficiently stabilized transverse mode oscillation in the high-power operation and satisfactorily small astigmatism while, at the same time, realizing multi-longitudinal mode oscillation in the low-power operation and substantially lowered noise level.

Figure 3:
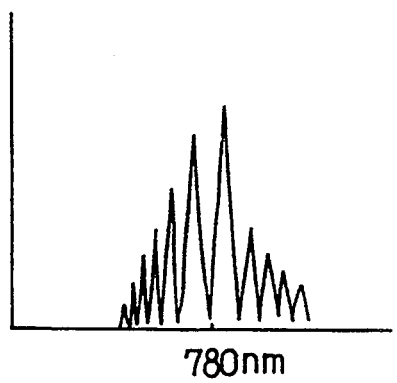
FIGS. 3 and 4 are diagrams showing longitudinal mode oscillation of the semiconductor laser according to Example 1 at a light power output of 3 mW and that of a conventional semiconductor laser in the same condition, respectively.
Figure 4:
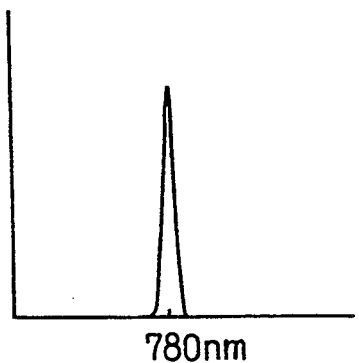

FIG. 3 shows the longitudinal mode oscillation characteristic in the low power operation (at a light power output of 3 mW) of the semiconductor laser embodying the present invention. For comparison, FIG. 4 shows the same characteristic of a conventional semiconductor laser. As can be understood from these figures, the semiconductor laser of the present invention outputs multi-longitudinal mode oscillation even in the low power operation.

Finally, each chip is coated at its front end face (emitting edge face) with an $Al_2O_3$ film having a thickness of $\lambda/4$ ($\lambda$=wavelength of laser light in the waveguide medium) and a reflectance of less than 10%, and at its rear end face with a four-layers film wherein an $Al_2O_3$ layer having a thickness of $\lambda/4$ and an a-Si film having the same thickness are alternately stacked.

Next, by way of examples, the relation between the thickness of the current-blocking layer and the characteristics of the semiconductor laser will be described in further detail. In the first example of the semiconductor laser the active layer was of double heterostructure; in the second example a beam-expanding layer was provided on the active layer; and in the third example the active layer was of MQW structure.

EXAMPLE 1

Six semiconductor lasers of the structure shown in FIG. 1 were fabricated of which current-blocking layers 6 of n-type GaAs were 10000 Å thick, 7000 Å thick, 6000 Å thick, 4500 Å thick, 3500 Å thick, and 2000 Å thick, respectively. As the clad layer 3 was formed a n-type $Al_{0.6}Ga_{0.4}As$ layer of about 13000 Å thickness, as the active layer 4 a n-type $Al_{0.15}Ga_{0.85}As$ layer of about 500 Å thickness, as the lower clad layer 5 a p-type $Al_{0.6}Ga_{0.4}As$ layer of 3000 Å thickness, as the upper clad layer 7 a p-type $Al_{0.6}Ga_{0.4}As$ layer of 10000 Å thickness, and as the cap layer 8 a p-type GaAs layer of 3000 Å thickness.

Each of the six semiconductor lasers was examined for its relative intensity of noise under the conditions: Po=3 mW, fc=1 MHz, and feedback rate of returning light was 1%.

The results were as shown in FIG. 2. As can be understood from FIG. 2, optical-feedback- induced noise decreased to a low level when the current-blocking layer was 6000 Å thick or thinner.

Next, a semiconductor laser of the above structure having the current-blocking layer of 4000 Å thickness was examined for its longitudinal mode oscillation characteristic at a light power of 3 mW. The results were as shown in FIG. 3. For comparison, the semiconductor laser having the current-blocking layer of 10000 Å thickness like a conventional one, was examined for the same characteristic under the same conditions. The results were as shown in FIG. 4. Note that the two semiconductor lasers were of the same structure except for the thickness of the current-blocking layer. As is apparent from FIGS. 3 and 4, the semiconductor laser of the present invention exhibited multi-longitudinal mode oscillation even at a low light power of 3 mW.

EXAMPLE 2

Figure 5:
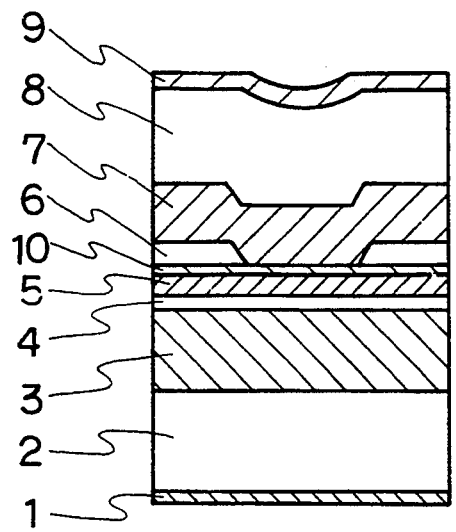
FIG. 5 is a schematic sectional view showing the structure of a semiconductor laser according to Example 2.

FIG. 5 shows the structure of a semiconductor laser wherein a beam-expanding layer 10 of $Al_zGa_{1-z}As$ ($0.2 \leq z \leq 0.7$) is provided between the lower clad layer and the current-blocking layer. This semiconductor laser is the same in structure as those in Example 1 except for the provision of the beam-expanding layer. The beam-expanding layer of the same conductivity type as the lower clad layer and is formed to have a thickness of about 100 to about 1000 Å. As described earlier, the beam-expanding layer is provided of which the Al content is made smaller than that of the clad layer and larger than that of the active layer ($y<z<x$), thereby meeting the requirements for a semiconductor laser, such as low ellipticity and high reliability.

In this Example, six semiconductor lasers were produced having the same structure and thicknesses of individual current-blocking layers as those in Example 1 except for the provision of the beam-expanding layer 10 of $Al_{0.3}Ga_{0.7}As$ ($z=0.3$).

Figure 6:
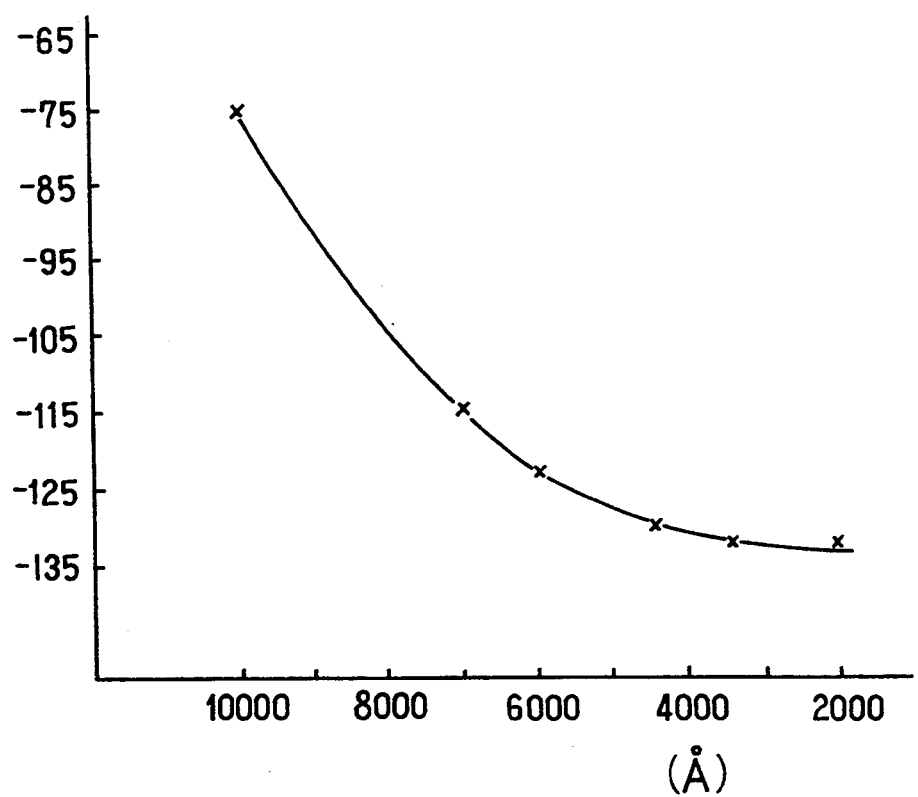
FIG. 6 is a graph of a relative intensity of noise (RIN) which varies with variation in the thickness of the current-blocking layer of the semiconductor laser according to Example 2.
Figure 7:
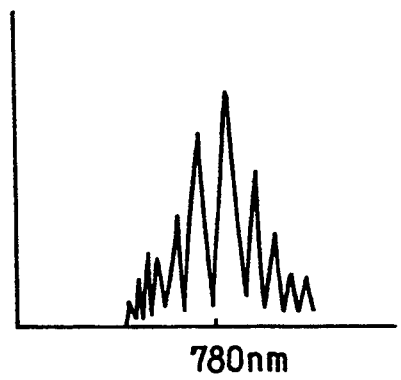
FIG. 7 is a diagram showing longitudinal mode oscillation of the semiconductor laser according to Example 3 at a light power output of 3 mW.

As in Example 1, each of the semiconductor lasers was examined for its relative intensity of noise under the conditions: Po=3 mW, fc=1 MHz, and feedback rate of returning-light was 1%. The results were as shown in FIG. 6. In addition, a semiconductor laser of which current-blocking layer was 4000 Å thick was examined for its longitudinal mode oscillation characteristic. The results were as shown in FIG. 7. As can be understood from FIGS. 6 and 7 even in the case that the beam expanding layer is inserted, also with the semiconductor laser having the beam-expanding layer, optical-feedback-induced noise decreased to a low level when the current-blocking layer was 6000 Å thick or thinner, and multi-longitudinal mode oscillation was exhibited even at a low light power of 3 mW.

EXAMPLE 3

Figure 8:
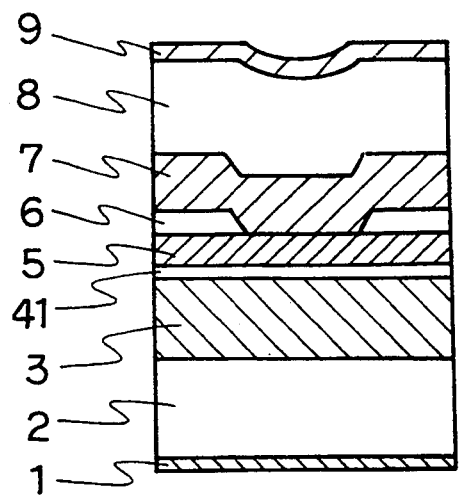
FIG. 8 is a schematic sectional view showing the structure of a semiconductor laser according to Example 3.
Figure 9:
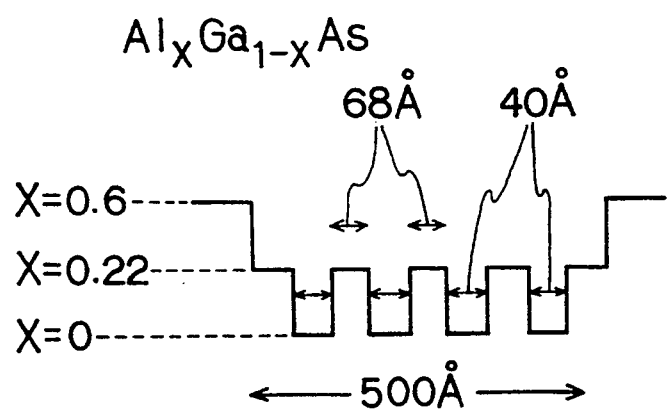
FIG. 9 is a diagram showing the structure of a band produced by an MQW active layer of the semiconductor laser according to Example 3.

FIG. 8 shows the structure of a semiconductor laser of which active layer is of a MQW structure. This semiconductor laser is the same in structure as those produced in Example 1 except that the active layer is a MQW active layer 41. The MQW active layer is of a multiple quantum well structure as seen in the energy band structure shown in FIG. 9 and wherein a barrier layer of $Al_pGa_{1-p}As$ ($0.2 \leq p \leq 0.35$) and a GaAs well layer are alternately stacked to form a multi-layered structure (3 to 11 layers in total). In this Example an $Al_{0.22}Ga_{0.78}As$ (p=0.22) layer of 68 Å thickness and a GaAs layer of 40 Å thickness were alternately stacked until 9 layers in total, and the resulting MQW active layer was 500 Å thick. The alternately stacking of these layers was achieved by, for example, opening and closing an Al shutter at short intervals during the growth of GaAs by the aforementioned method. Six semiconductor lasers with their current-blocking layers 6 of 10000 Å, 7000 Å, 6000 Å, 4500 Å, 3500 Å, and 2000 Å in thickness, respectively, were produced in the same manner (crystal growth method for the layers other than the active layer, the respective thicknesses of those layers, dopant metals used, and the like) as in Example 1 except that the active layer was the MQW active layer.

Figure 10:
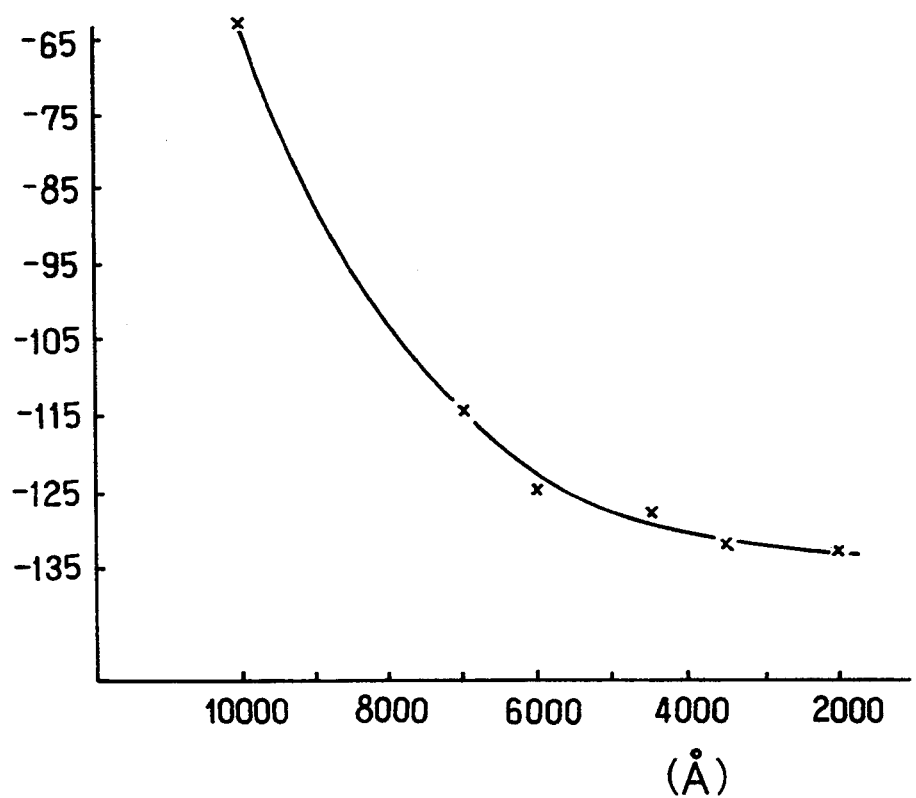
FIG. 10 is a graph of a relative intensity of noise (RIN) which varies with variation in the thickness of the current-blocking layer of the semiconductor laser according to Example 3.
Figure 11:
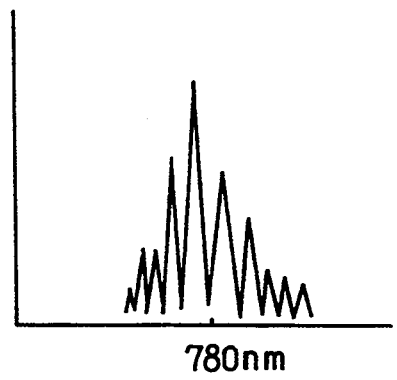
FIG. 11 is a diagram showing longitudinal mode oscillation of the semiconductor laser according to Example 3 at a light power output of 3 mW.

As in Example 1, each of the semiconductor lasers was examined for its relative intensity of noise under the conditions: Po=3 mW, fc=1 MHz, and feedback rate of returning light was 1%. The results were as shown in FIG. 10. In addition, a semiconductor laser of which current-blocking layer was 4000 Å thick was examined for its longitudinal mode oscillation characteristic. The results were as shown in FIG. 11. As can be understood from FIGS. 10 and 11, also with the semiconductor laser having the MQW active layer, optical-feedback-induced noise decreased to a low level when the current-blocking layer was 6000 Å thick or thinner, and multi-longitudinal mode oscillation was exhibited even at a low light power of 3 mW.

As has been described, since the thickness of the current-blocking layer of the semiconductor laser according to the present invention is adjusted to 2000 to 6000 Å, the following effects are exhibited:

(1) a self-aligned type, high-power semiconductor laser can be obtained which exhibits multi-longitudinal mode oscillation in the low power operation (at a light power output of, for example, 3 mW) though it is of a refractive index guiding structure capable of single transverse mode oscillation in up to the high-power operation;

(2) other characteristics (for example, small astigmatism) required for use with a magneto-optical disk are realized as in a conventional semiconductor laser;

(3) there are not caused complication of the production process and a decrease in production yield; and (4) because of a thin current-blocking layer, the time for crystal growth thereof can be reduced thereby enhancing the productivity.

Though several embodiments of the present invention are described above, it is to be understood that the present invention is not limited only to the above-mentioned, various changes and modifications may be made in the invention without departing from the spirit and scope thereof.

What is claimed is:

1. In a self-aligned type semiconductor laser of AlGaAs system having a waveguide mechanism resulting from a complex refractive index profile, which comprises:

an active layer;

a clad layer on the active layer; and a current-blocking layer formed on the clad layer, the current-blocking layer being 2000 to 6000 Å thick, and wherein a distance between the active layer and the current-blocking layer is 2500 to 3500 Å.

2. The semiconductor laser of claim 1, which is of a double heterostructure.

3. The semiconductor laser of claim 2, wherein said clad layer is composed of $Al_xGa_{1-x}As$ ($0.35 \leq x \leq 0.7$), said active layer is composed of $Al_yGa_{1-y}As$ ($0 \leq y \leq 0.15$), and said current-blocking layer is composed of GaAs.

4. The semiconductor laser of claim 3, further comprising a beam-expanding layer of $Al_zGa_{1-z}As$ ($0.2 \leq z \leq 0.7$) which is sandwiched, together with a portion of said clad layer, between said active layer and said current-blocking layer, while the Al content z satisfies the relation $y < z < x$.

5. The semiconductor laser of claim 1, which is coated at a light-emitting face thereof with an $Al_1O_3$ film having a thickness of $\lambda/4$ where $\lambda$ is a wavelength of laser light in a waveguide medium, and at a rear end face thereof with a four layers film in which an $Al_2O_3$ layer having a thickness of $\lambda/4$ and an amorphous silicon layer having a thickness of $\lambda/4$ are alternately stacked.

6. The semiconductor laser of claim 1, wherein said active layer is of a multiple quantum well structure.

7. The semiconductor laser of claim 6, wherein said multiple quantum well structure is of a stacked structure in which an $Al_pGa_{1-p}As$ layer and a GaAs layer are alternately stacked.

* * * * *